(12) United States Patent
Kim et al.

(10) Patent No.: US 7,531,956 B2
(45) Date of Patent: May 12, 2009

(54) LIGHT EMITTING DEVICE AND PHOSPHOR FOR THE SAME

(75) Inventors: Chang-Hae Kim, Daejeon-si (KR);
Joung-Kyu Park, Daejeon-si (KR);
Sang-Kee Kim, Gwangju-si (KR);
Choong-Youl Kim, Gwangju-si (KR)

(73) Assignees: LG Innotek Co., Ltd., Seoul (KR);
Korea Research Institute of Chemical Technology, Daejeon-si (KR)

( * ) Notice: Subject to any disclaimer, the term of this patent is extended or adjusted under 35 U.S.C. 154(b) by 468 days.

(21) Appl. No.: 10/564,406

(22) PCT Filed: Apr. 7, 2005

(86) PCT No.: PCT/KR2005/001008

§ 371 (c)(1),
(2), (4) Date: Jan. 13, 2006

(87) PCT Pub. No.: WO2005/098972

PCT Pub. Date: Oct. 20, 2005

(65) Prior Publication Data

US 2006/0284185 A1 Dec. 21, 2006

(30) Foreign Application Priority Data

Apr. 7, 2004 (KR) .................. 10-2004-0023695

(51) Int. Cl.
*H01J 1/62* (2006.01)
*H01J 63/04* (2006.01)

(52) U.S. Cl. .................. 313/503; 313/484; 313/487; 313/502; 313/506; 313/512; 257/79; 257/89; 257/98; 252/301.4 F

(58) Field of Classification Search .................. 313/487, 313/484, 502, 503, 506, 512; 257/79, 89, 257/98, 99, 100; 252/301.4 F
See application file for complete search history.

(56) References Cited

U.S. PATENT DOCUMENTS

| 6,066,861 | A | 5/2000 | Hohn et al. |
| 6,621,211 | B1 | 9/2003 | Srivastava et al. |
| 2003/0006469 | A1 | 1/2003 | Ellens et al. |
| 2004/0104391 | A1* | 6/2004 | Maeda et al. .................. 257/79 |

(Continued)

FOREIGN PATENT DOCUMENTS

CN   1207206 A   2/1999

(Continued)

OTHER PUBLICATIONS

Park et al., "Application of Strontium Silicate Yellow Phosphor for White Light-Emitting Diodes", Applied Physics Letters, vol. 84, No. 10, pp. 1647-1649, American Institute of Physics (Mar. 8, 2004).

*Primary Examiner*—Nimeshkumar D. Patel
*Assistant Examiner*—Thomas A Hollweg
(74) *Attorney, Agent, or Firm*—Birch, Stewart, Kolasch & Birch, LLP

(57) ABSTRACT

Provided is a light emitting device including a light emitting chip, and a phosphor through which a light emitting from the light emitting chip at least partially passes such that the light is converted into lights having at least two different wavelengths and emitted. The light emitting device emits white light using the phosphor.

19 Claims, 2 Drawing Sheets

U.S. PATENT DOCUMENTS

2005/0168127 A1 * 8/2005 Shei et al. .................. 313/487

FOREIGN PATENT DOCUMENTS

| | | |
|---|---|---|
| CN | 1289455 A | 3/2001 |
| CN | 1381072 A | 11/2002 |
| JP | 2001-143869 A | 5/2001 |
| WO | WO-00/33389 L | 6/2000 |
| WO | WO-02/054503 A1 | 7/2002 |
| WO | WO-03/021691 A1 | 3/2003 |
| WO | WO-03/032407 A1 | 4/2003 |

* cited by examiner

LIGHT EMITTING DEVICE AND PHOSPHOR FOR THE SAME

TECHNICAL FIELD

The present invention relates to a light emitting device and phosphor thereof, and more particularly, to a mixed type phosphor where yellow silicate-based phosphor and green silicate-based phosphor are mixed, and a white light emitting device emitting white light using the mixed phosphor.

BACKGROUND ART

Methods for manufacturing a general GaN white light emitting device are generally classified into two methods, one is a method using a single chip, in which a white light emitting device is obtained by further forming a phosphor layer on a blue light emitting device or a UV light emitting device, and the other is a method using a multi-chip, in which two or more light emitting devices are combined to obtain a white light emitting device. The white light emitting device is exemplified by a white light emitting diode (LED), but is not limited thereto.

A representative method to realize a white light emitting device in the form of a multi-chip is manufactured by combining three R, G and B light emitting devices. However, the multi-chip type light emitting device has a drawback in that respective chips have non-uniform operation voltages and outputs of the respective chips are varied depending on a surrounding temperature, so that a color coordinate is changed. Due to the above drawback, the multi-chip type light emitting device is suitable for a particular lighting needing to display various colors because it controls the respective color light emitting devices rather than realizes the white light emitting device, but is not suitable for the white light emitting device.

Owing to the above reason, a binary system having an easy fabrication and superior efficiency is representatively used for realizing the white light emitting device. The binary system allows white light to be emitted by combining a blue light emitting device with a yellow phosphor layer, which is excited by the blue light emitting device to emit yellow light.

In detail, the binary system is a light emitting device, which uses the blue LED as an excitation light source and excits YAG (Yttrium Aluminum Garnet) phosphor using rare-earth 3-valent ion of Ce3+ as an activator, i.e., YAG:Ce phosphor using an excitation light emitted from the blue LED.

Also, the white light emitting device employs various packages according to its applications, and representatively includes a surface mounting device (SMD) type ultra-miniaturized light emitting device used in a backlight of a handheld terminal, and a vertical lamp type light emitting device used for an electronic board, a solid display device or an image display.

Index for analyzing the characteristics of white light includes a correlated color temperature (CCT) and a color rendering index (CRI).

In detail, the CCT indicates a temperature of an article when the article shines with emitting visible rays, it seems that a color of the article is identical to a color that a black body radiates at a temperature and it is assumed that the temperature of the black body is equal to that of the article. As CCT increases, the light dazzles a human being and becomes a bluish white. Therefore, in spite of identical white lights, when the CCT is low, people feel more warm, whereas when the CCT is high, people feel cold. Accordingly, by adjusitng the CCT, it is possible to meet even the specification of a particular lighting requiring various color feelings.

In a conventional white light emitting device using YAG: Ce phosphor, since the CCT is fixed only to 6000-8000 K, it is impossible to display various color feelings by adjusting the CCT.

The CRI indicates a degree that the color of an article is changed when sun light or artificial light is irradiated onto the article. When the color of the article is identical to that under sun light, the CRI is defined 100. In other words, the CRI is an index to show how the color of the article under the artificial lighting is close to that under sun light, and has a value of 0 to 100. Accordingly, as the CRI approaches 100, i.e., white light, people can feel that the color of the article under the artificial lighting has no difference than that under sun light.

At present, an incandescent lamp has a CRI of more than 80 and a fluorescent lamp has a CRI of more than 75, while a white LED using YAG:Ce phosphor has a CRI of approximately 70-75, which is low relative to those of the incandescent lamp and the fluorescent lamp.

Accordingly, it is problematic that the white LED using the conventional YAG:Ce phosphor is narrow in CCT and relatively low in CRI.

DISCLOSURE OF INVENTION

Technical Problem

The present invention is proposed to solve one or more problems due to limitations and disadvantages of the related art.

An object of the present invention is to provide a light emitting device and a phosphor thereof in which the CCT is adjustably extended to a wider range.

Another object of the present invention is to provide a light emitting device and a phosphor thereof in which the CRI of the light emitting device is elevated such that the light emitting device operates with emitting a light closest to natural light.

A further object of the present invention is to provide a light emitting device and a phosphor thereof in which various kinds of phosphors are mixed such that color coordinate, CCT and CRI can be smoothly controled in a user's desired value.

Technical Solution

To accomplish the above objects and other advantages, there is provided a light emitting device including: a light emitting chip; and a phosphor through which a first light emitting from the light emitting chip passes, wherein the phosphor comprises a first silicate-based phosphor exciting a second light having a first centered emission peak using the first light and a second silicate-based phosphor exciting a third light having a second centered emission peak using the first light.

According to another aspect of the present invention, there is provided a phosphor of a light emitting device, including: a first silicate-based phosphor excited by a light generated by a light emitting chip and having a chemical formula of $Sr_{3-x}SiO_5:Eu^{2+}x$ ($0<x\leq1$); and a second silicate-based phosphor excited by the light generated by the light emitting chip and having a chemical formula selected from the group consisting of $Ba_2\text{-}xSiO_4:Eu^{2+}x$ ($0.001\leq x\leq1$), $Ca_1\text{-}xMgSi_2O_7:Eu^{2+}x$ ($0.001\leq x\leq1$) and $Sr_2\text{-}xSiO_4:Eu^{2+}x$ ($0.001\leq x\leq1$).

According to a further aspect of the present invention, there is provided a ligth emitting device including: a substrate; a light emitting chip emitting a light; a connection part for electrically connecting the substrate with the light emitting chip; a phosphor encapsulating the light emitting chip and through which the light passes; a first silicate-based phosphor contained in the phosphor and having a chemical formula of $Sr_{3-x}SiO_5:Eu^{2+}x$ ($0<x\leq1$); and a second silicate-based phosphor contained in the phosphor and having a chemical formula selected from the group consisting of $Ba_2$-$xSiO_4$:$Eu^{2+}x$ ($0.001\leq x\leq1$), $Ca_{1-x}MgSi_2O_7:Eu^{2+}x$ ($0.001\leq x\leq1$) and $Sr_{2-x}SiO_4:Eu^{2+}x$ ($0.001\leq x\leq1$).

According to still another aspect of the present invention, there is provided a ligth emitting device including: a leadframe; a light emitting chip emitting a light; a connection part for electrically connecting the leadframe with the light emitting chip; a phosphor encapsulating and molding the light emitting chip and through which the light passes; a first silicate-based phosphor contained in the phosphor and having a chemical formula of $Sr_{3-x}SiO_5:Eu^{2+}x$ ($0<x\leq1$); and a second silicate-based phosphor contained in the phosphor and having a chemical formula selected from the group consisting of $Ba_2$-$xSiO_4:Eu^{2+}x$ ($0.001\leq x\leq1$), $Ca_{1-x}MgSi_2O_7:Eu^{2+}x$ ($0.001\leq x\leq1$) and $Sr_{2-x}SiO_4:Eu^{2+}x$ ($0.001\leq x\leq1$).

According to a further another aspect of the present invention, there is provided a ligth emitting device including: a light emitting chip emitting a light; and a resin-based phosphor through which the light emitting from the light emitting chip passes; wherein the phosphor comprises a yellow silicate-based phosphor exciting a second light having a frst centered emission peak using the first light and a green silicate-based phosphor exciting a third light having a second centered emission peak using the first light, and the green silicate-based phosphor and the yellow silicate-based phosphor exist at a ratio of 1:2 to 1:5.

Advantageous Effects

According to the present invention, the product quality of the light emitting device is further enhanced and the light emitting state is controllable depending on a user's desire.

Also, since artificial white light closest to the natural white light can be realized, the light emitting device, i.e., LED can be extended to more many applications.

BRIEF DESCRIPTION OF THE DRAWINGS

The spirit of the present invention will be understood from the accompanying drawings. In the drawings.

BEST MODE FOR CARRYING OUT THE INVENTION

Hereinafter, preferred embodiments of the present invention will be described in detail with reference to accompanying drawings.

Figure 1:
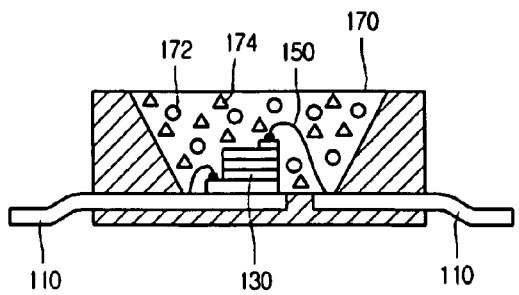
FIG. 1 is a sectional view of a white light emitting device manufactured in an SMD type according to the spirit of the present invention.

FIG. 1 is a sectional view of a white light emitting device manufactured in a surface-mount device (SMD) type according to the present invention.

Referring to FIG. 1, the SMD white light emitting device of the present invention includes: leadframes 110 having anode and cathode; a light emitting chip 130 of InGaN for generating light having a centered emission peak in a range of 400-480 nm when a voltage is applied; a wire 150 serving as a connection part for conduction between the leadframes 110 and the light emitting chip 130; a phosphor layer 170 provided in the form of a molded light transmitting epoxy resin or an light transmitting silicon resin around the light emitting chip 130.

The phosphor layer 170 includes a phosphor to allow light of a wavelength different from the light emitting chip 130 to be emitted using the light emitted from the light emitting chip 130, thereby resultantly allowing light desired by a user, e.g., white light to be emitted.

In detail, the phosphor layer 170 includes a yellow silicate phosphor 172 having a chemical formula of $Sr_{3-x}SiO_5:Eu^{2+}x$ ($0<x\leq1$) and a green silicate phosphor 174 having a chemical formula selected from the group consisting of $Ba_2$-$xSiO_4:Eu^{2+}x$ ($0.001\leq x\leq1$), $Ca_{1-x}MgSi_2O_7:Eu^{2+}x$ ($0.001\leq x\leq1$) and $Sr_{2-x}SiO_4:Eu^{2+}x$ ($0.001\leq x\leq1$), the phosphors 172 and 174 being mixed therein.

Resultantly, the phosphor layer 170 is provided in a state where the yellow silicate phosphor 172 and the green silicate phosphor 174 are mixed with a base of an light transmitting epoxy resin or an light transmitting silicon resin. Also, since the phosphor layer 170 is molded around the light emitting chip 130, the light emitted from the light emitting chip 130 excites the phosphors 172 and 174 so that light desired by a user, e.g., white light may be emitted.

Here, the mixing ratio of the yellow silicate phosphor 172 and green silicate phosphor 174 mixed in the phosphor layer 170 may be 1:1 to 1:9 or 9:1 to 1:1.

Particularly, in the case where the light emitting device is used in the form of a top view, the mixing ratio of the yellow silicate phosphor 172 and green silicate phosphor 174 may be 1:2 to 1:3. Also, in the case where the light emitting device is used in the form of a side view, the mixing ratio of the yellow silicate phosphor 172 and green silicate phosphor 174 may be 1:3 to 1:4.

Here, the particle size of the fluorescent bodies 172 and 174 may be d90≦20 ▯, 5≦d50≦10 ▯. The d means that filtering rate can reach a % when particles are filtered by a predetermined mesh.

Also, the resin with which the phosphor is mixed may be a light transmitting resin, for example, an epoxy resin or a silicon resin.

Figure 2:
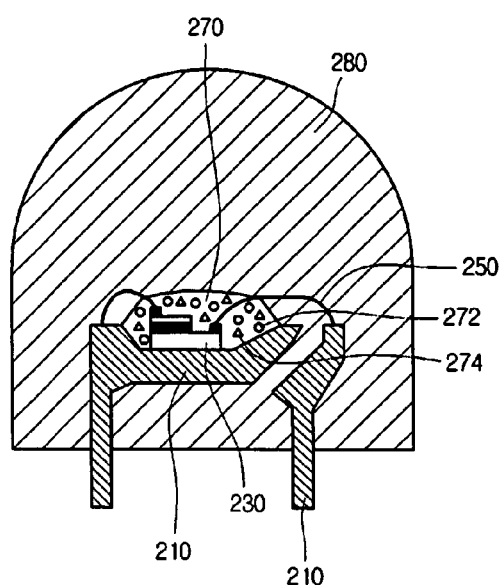
FIG. 2 is a sectional view of a light emitting device manufactured in a vertical lamp type according to the spirit of the present invention.

FIG. 2 is a sectional view of a light emitting device manufactured in the form of a vertical lamp type according to another embodiment of the present invention.

Referring to FIG. 2, the light emitting device of a vertical-lamp type includes: a pair of leadframes 210; a light emitting chip 230 of InGaN mounted on the leadframes 210;

a wire 250 serving as a connection part for electrically connecting the leadframes 210 with the light emitting chip 230; a phosphor layer 270 enclosing the entire surrounding of the light emitting chip 230; and an enclosure material 280 at the outside of the phosphor layer 270. The phosphor layer 270 is provided in a state where predetermined fluorescent bodies are mixed into an light transmitting epoxy resin or a light transmitting silicon resin. The phosphor layer 270 encloses the outer space of the light emitting chip 230. Also, the phosphor layer 270 in a resin state is molded around the light emitting chip 230.

Like the first embodiment, the phosphor layer 270 includes yellow silicate phosphor 172 having a chemical formula of Sr3-xSiO5:Eu$^{2+}$x (0<x≦1) and green silicate phosphor 174 having a chemical formula selected from the group consisting of Ba2-xSiO4:Eu$^{2+}$x (0.001≦x≦1), Ca1-xMgSi2O7:Eu$^{2+}$x (0.001≦x≦1) and Sr2-xSiO4:Eu$^{2+}$x (0.001≦x≦1), the phosphors 172 and 174 being mixed therein.

Besides, since the ratio of the yellow silicate phosphor and the green silicate phosphor, the weight ratio, and the particle size are the same as those in the first embodiment, detailed description thereof will be omitted. Operation and action of the phosphor layer 270 will be described below in detail.

The phosphor layer 270 encapsulates the light emitting chip 230 on the whole so as to allow the light from the light emitting chip 230 to pass therethrough.

At this point, when power is applied to the light emitting chip 230, the light emitting chip 230 emits blue light having the wavelength of 400-480 nm. Light having a centered emission peak of 550-600 nm is excited in the yellow silicate phosphor 272 by blue light, and light having a centered emission peak of 500-550 nm is excited in the green silicate phosphor 274.

In detail, in the light emitting chips 130 and 230 of InGaN, the blue light having the wavelength of 400-480 nm is emitted and passes through the phosphor layer 270. At this point, part of the emitted light excites the yellow silicate phosphors 172 and 272 and green silicate phosphors 174 and 274 while passing through the phosphor layer 270. Therefore, the light having a centered emission peak of 550-600 nm is excited in the yellow silicate phosphors 172 and 272 and the light having a centered emission peak of 500-550 nm is excited in the green silicate phosphors 174 and 274. Of course, the rest light that does not pass through the phosphors 172, 272, 174, and 274 is directly emitted as the blue light originally emitted from the light emitting chip 230.

Figure 3:
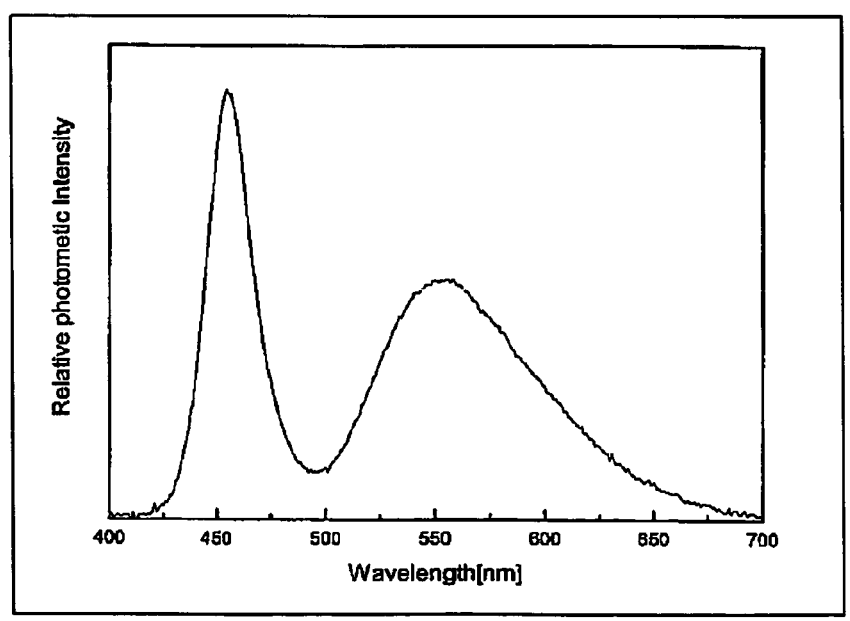
FIG. 3 is a graph of a light emission spectrum of a light emitting device according to the present invention.

It is surmised that a light-emission spectrum of the inventive light emitting device has light emission in a wide range of wavelengths on the whole by the light excited in the phosphor layer 270 where the two kinds of phosphors are mixed and the light directly emitted from the light emitting chip 230. FIG. 3 is a view of a light-emission spectrum of a light emitting device according to the present invention. Referring to FIG. 3, light having a wide range of wavelengths ranged from 400 nm to 700 nm is emitted from the light emitting device. Of course, it is easily surmised that light approaches a white color even more when light having a wide range of wavelengths is emitted and a state of light desired by a user can be easily controlled when a mixing ratio of the phosphors 172, 272, 174, and 274 is controlled.

Figure 4:
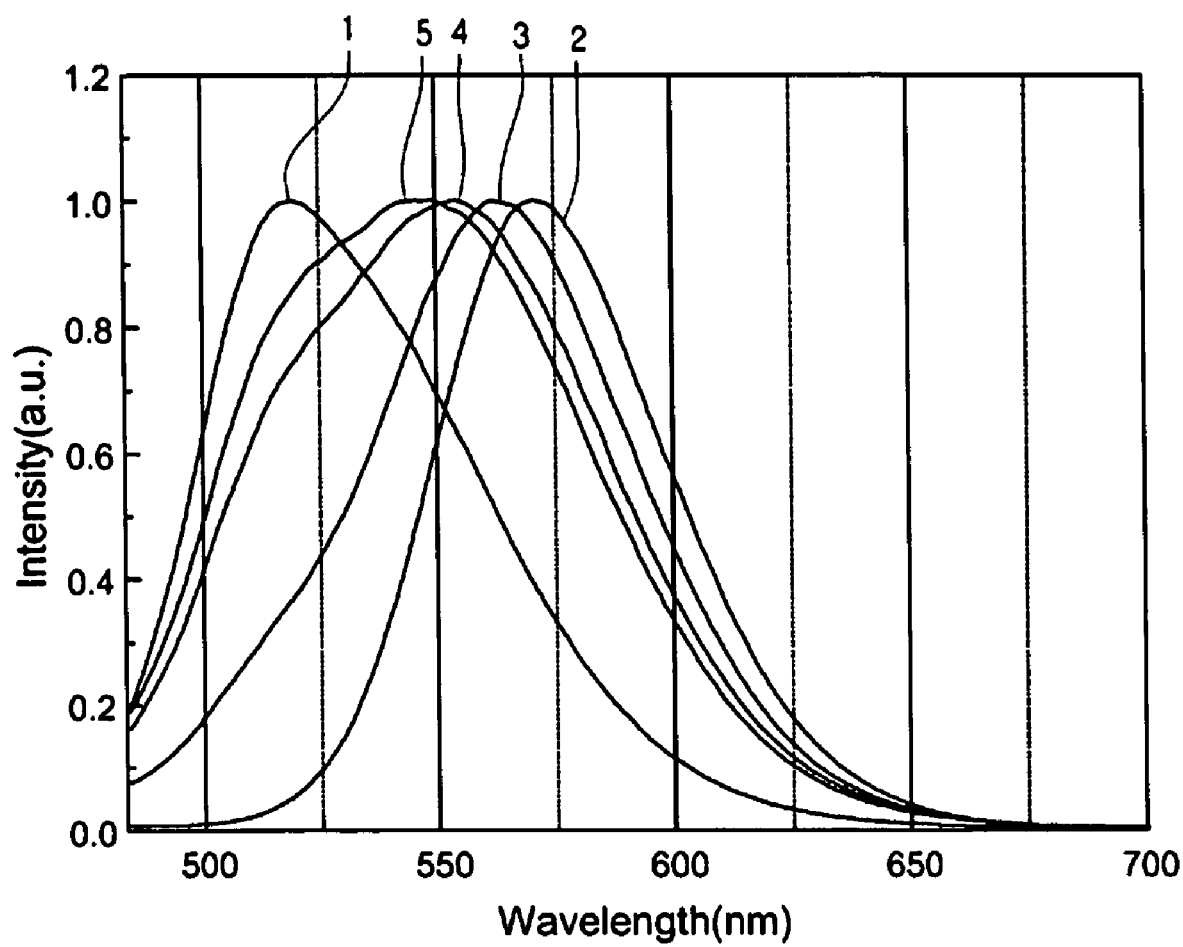
FIG. 4 is a graph showing a emission spectrum emitting from a light emitting device according to the present invention when a mixing ratio of a phosphor mixed in a phosphor layer of the light emitting device.

FIG. 4 is a graph of a light-emission spectrum of light emitted from a light emitting device when a mixing ratio of phosphors mixed into the phosphor layer of the inventive light emitting device changes.

FIG. 4 illustrates (1) a light-emission spectrum line due to only the green silicate phosphor, (2) a light-emission spectrum line due to only the yellow silicate phosphor, (3) a light-emission spectrum line for the case where the green silicate phosphor and the yellow silicate phosphor are mixed at the ratio of 3:1, (4) a light-emission spectrum line for the case where the green silicate phosphor and the yellow silicate phosphor are mixed at the ratio of 5:1, and (5) a light-emission spectrum line for the case where the green silicate phosphor and the yellow silicate phosphor are mixed at the ratio of 7:1. Though light having the wavelength less than 500 nm is not illustrated, it is easily surmised that light emitted from the blue light emitting chip 230 and that does not pass through the phosphor corresponds to that light.

As described above, it is possible to control the characteristics of the light from the light emitting device by changing the content ratio of the green silicate phosphor and the yellow silicate phosphor. Also, it is possible to control color coordinates, CCT, CRI by controlling the characteristic of the emitted light. Therefore, the state of light can be controlled to the direction as desired by a user.

Mode for the Invention

The inventive light emitting device can be used as a light emitting device for a backlight of a keypad.

At this point, in the case where light of the light emitting device is white, the green phosphor and the yellow phosphor are mixed at a ratio of 1:2-1:5 and the content of the phosphors in the light transmitting resin may be 15-30 wt %. Also, in the case where light of the light emitting device is bluish white, the green phosphor and the yellow phosphor are mixed at a ratio of 1:2-1:5 and the content of the phosphors in the light transmitting resin may be 5-10 wt %.

Also, the resin into which the phosphors are mixed may be an epoxy resin or a silicon resin.

Detail conditions not described are the same as those described with reference to FIG. 1.

INDUSTRIAL APPLICABILITY

According to the light emitting device and the phosphors thereof of the present invention, white light approaching natural light even more can be realized.

Also, since color coordinates, color temperature, color rendering indexes of light emitted from the light emitting device can be controlled, preference of a user is promoted even more.

Also, the inventive light emitting device has a practical usage since it can be used as an energy-saving type light source capable of replacing a backlight of a cellular phone, a lamp, and a headlight.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

The invention claimed is:

1. A light emitting device comprising:
   a light emitting chip; and
   a phosphor through which a first light emitting from the light emitting chip passes,
   wherein the phosphor comprises a first silicate phosphor exciting a second light having a first centered emission peak using the first light and a second silicate phosphor exciting a third light having a second centered emission peak using the first light, and
   wherein the first silicate phosphor has a chemical formula of $Sr_{3-x}SiO_5:Eu^{2+}{}_x$ (0<x≦1).

2. The light emitting device according to claim 1, wherein the first centered emission peak is in a range of 550-600 nm.

3. The light emitting device according to claim 1, wherein the second centered emission peak is in a range of 500-550 nm.

4. The light emitting device according to claim 1, wherein the second silicate phosphor has a chemical formula selected from the group consisting of $Ba_{2-x}SiO_4:Eu^{2+}_x$ (0.001<x≦1), $Ca_{1-x}MgSi_2O_7:Eu^{2+}_x$ (0.001<x≦1) and $Sr_{2-x}SiO_4:Eu^{2+}_x$ (0.001<x≦1).

5. The light emitting device according to claim 1, wherein the first silicate phosphor and the second silicate phosphor exist at a ratio of 1:1 to 1:9 or 9:1 to 1:1.

6. The light emitting device according to claim 1, wherein the phosphor has a particle size of $d_{90} \leq 20$ μm, $5 \leq d_{50} \leq 10$ μm.

7. The light emitting device according to claim 1, wherein the light emitting chip emits blue light.

8. The light emitting device according to claim 1, wherein the phosphor is molded in a periphery of the light emitting chip or on the light emitting chip.

9. The light emitting device according to claim 1, wherein the phosphor is manufactured by mixing the phosphor with a light transmitting resin.

10. The light emitting device according to claim 9, wherein the resin is an epoxy resin or a silicon resin.

11. The light emitting device according to claim 1, wherein the first silicate phosphor is a yellow series and the second silicate phosphor is a green series.

12. A phosphor of a light emitting device, comprising:
a first silicate phosphor excited by a light generated by a light emitting chip and having a chemical formula of $Sr_{3-x}SiO_5:Eu^{2+}_x$ (0<x≦1); and
a second silicate phosphor excited by the light generated by the light emitting chip and having a chemical formula selected from the group consisting of $Ba_{2-x}SiO_4:Eu^{2+}_x$ (0.001<x≦1), $Ca_{1-x}MgSi_2O_7:Eu^{2+}_x$ (0.001<x≦1) and $Sr_{2-x}SiO_4:Eu^{2+}_x$ (0.001<x≦1).

13. A light emitting device comprising:
a substrate;
a light emitting chip emitting a light;
a connection part for electrically connecting the substrate with the light emitting chip;
a phosphor encapsulating the light emitting chip and through which the light passes;
a first silicate phosphor contained in the phosphor and having a chemical formula of $Sr_{3-x}SiO_5:Eu^{2+}_x$ (0<x≦1); and
a second silicate phosphor contained in the phosphor and having a chemical formula selected from the group consisting of $Ba_{2-x}SiO_4:Eu^{2+}_x$ (0.001<x≦1), $Ca_{1-x}MgSi_2O_7:Eu^{2+}_x$ (0.001<x≦1) and $Sr_{2-x}SiO_4:Eu^{2+}_x$ (0.001<x≦1).

14. The light emitting device according to claim 13, wherein when the light emitting device is a top view type, the first silicate phosphor and the second silicate phosphor exist at a ratio of 1:2 to 1:3.

15. The light emitting device according to claim 13, wherein when the light emitting device is a side view type, the first silicate phosphor and the phosphor exist at a ratio of 1:3 to 1:4.

16. A light emitting device comprising:
a leadframe;
a light emitting chip emitting a light;
a connection part for electrically connecting the leadframe with the light emitting chip;
a phosphor encapsulating and molding the light emitting chip and through which the light passes;
a first silicate phosphor contained in the phosphor and having a chemical formula of $Sr_{3-x}SiO_5:Eu^{2+}_x$ (0<x≦1); and
a second silicate phosphor contained in the phosphor and having a chemical formula selected from the group consisting of $Ba_{2-x}SiO_4:Eu^{2+}_x$ (0.001<x≦1), $Ca_{1-x}MgSi_2O_7:Eu^{2+}_x$ (0.001<x≦1) and $Sr_{2-x}SiO_4:Eu^{2+}_x$ (0.001<x≦1).

17. A light emitting device comprising:
a light emitting chip emitting a light; and
a resin-based phosphor through which the light emitting from the light emitting chip passes;
wherein the phosphor comprises a yellow silicate phosphor exciting a second light having a first centered emission peak using the first light and a green silicate phosphor exciting a third light having a second centered emission peak using the first light, and the green silicate phosphor and the yellow silicate phosphor exist at a ratio of 1:2 to 1:5, and
wherein the yellow silicate phosphor has a chemical formula of $Sr_{3-x}SiO_5:Eu^{2+}_x$ (0<x≦1).

18. The light emitting device according to claim 17, wherein the phosphor is contained at a ratio of 15-30 wt % with respect to the base so as to emit white light.

19. The light emitting device according to claim 17, wherein the phosphor is contained at a ratio of 5-15 wt % with respect to the base so as to emit bluish light.

* * * * *